US007997919B2

(12) United States Patent
Morinari

(10) Patent No.: US 7,997,919 B2
(45) Date of Patent: Aug. 16, 2011

(54) ELECTRICAL COMPONENT SOCKET

(75) Inventor: Takashi Morinari, Saitama (JP)

(73) Assignee: Enplas Corporation, Kawaguchi-shi (JP)

( * ) Notice: Subject to any disclaimer, the term of this patent is extended or adjusted under 35 U.S.C. 154(b) by 0 days.

(21) Appl. No.: 12/757,646

(22) Filed: Apr. 9, 2010

(65) Prior Publication Data

US 2010/0261371 A1    Oct. 14, 2010

Related U.S. Application Data

(63) Continuation of application No. PCT/JP2008/068550, filed on Oct. 14, 2008.

(30) Foreign Application Priority Data

Oct. 17, 2007  (JP) ................................. 2007-270513

(51) Int. Cl.
*H01R 13/62* (2006.01)

(52) U.S. Cl. ...................................................... 439/331

(58) Field of Classification Search .......... 439/330–331, 439/70–73, 68
See application file for complete search history.

(56) References Cited

U.S. PATENT DOCUMENTS

| 5,244,404 | A |   | 9/1993  | Kishi et al. |         |
|-----------|---|---|---------|--------------|---------|
| 5,326,271 | A |   | 7/1994  | Kishi et al. |         |
| 6,155,859 | A | * | 12/2000 | Choy         | 439/331 |
| 6,213,806 | B1|   | 4/2001  | Choy         |         |
| 6,638,091 | B2|   | 10/2003 | Yamagishi    |         |
| 7,042,238 | B2|   | 5/2006  | Tani         |         |
| 7,097,488 | B2|   | 8/2006  | Hayakawa et al. |     |
| 7,118,386 | B2| * | 10/2006 | Sato et al.  | 439/73  |
| 7,278,868 | B2| * | 10/2007 | Sato et al.  | 439/259 |

(Continued)

FOREIGN PATENT DOCUMENTS

JP   04-169086 A   6/1992

(Continued)

OTHER PUBLICATIONS

International Preliminary Examination Report and English Translation of PCT/JP2008/068550, dated Apr. 29, 2010 and May 20, 2010, 11 pages.

(Continued)

*Primary Examiner* — Jean F Duverne
(74) *Attorney, Agent, or Firm* — Foley & Lardner LLP

(57) ABSTRACT

An electrical component socket according to the present invention includes: a socket body 1 including an accommodating portion 4 detachably accommodating therein an electrical component; plural contact pins 5 disposed in the socket body, contactable with terminals of an electric component; and a socket cover 2 rotatably attached to the socket body 1, for, when the socket cover 2 is closed, press-retaining an electrical component accommodated in the accommodating portion 4 so that the terminals of an electrical component are in contact with the contact pins 5, in which the socket cover 2 is disposed movable so as to be close to and apart from the socket body 1 when the socket cover 2 closed, so that the electrical component accommodated to be press-retained in the accommodating portion 4 can be urged by a predetermined urging force according to a thickness of the electrical component or a number of terminals thereof. Thus, the electrical component socket according to the present invention is capable of urging the electrical component by a predetermined urging force even in the case of different thickness of the electrical component or different number of terminals thereof, and is applicable to a high functional device of larger heat dissipation amount.

6 Claims, 6 Drawing Sheets

U.S. PATENT DOCUMENTS

| | | | |
|---|---|---|---|
| 7,556,507 B2 * | 7/2009 | Kunioka et al. | 439/73 |
| 7,568,918 B2 * | 8/2009 | Uratsuji et al. | 439/73 |
| 2002/0106925 A1 * | 8/2002 | Yamagishi | 439/331 |
| 2004/0070414 A1 | 4/2004 | Tani | |
| 2005/0181656 A1 | 8/2005 | Hayakawa et al. | |

FOREIGN PATENT DOCUMENTS

| | | |
|---|---|---|
| JP | 08-203642 A | 8/1996 |
| JP | 11-251026 A | 9/1999 |
| JP | 11-251027 A | 9/1999 |
| JP | 2001-281295 A | 10/2001 |
| JP | 2002-231400 A | 8/2002 |
| JP | 2005-149953 A | 6/2005 |
| WO | WO 03/058768 A1 | 7/2003 |

OTHER PUBLICATIONS

International Preliminary Report on Patentability and its English Translation of PCT/JP2008/068550, dated Apr. 29, 2010 and May 20, 2010, 11 pages.

* cited by examiner

ELECTRICAL COMPONENT SOCKET

This application is a continuation of PCT/JP2008/068550, filed on Oct. 14, 2008.

TECHNICAL FIELD

The present invention relates to an electrical component socket for closing a socket cover to a socket body to press-retain an electrical component accommodated in the socket body, and making terminals of the electric component to be in contact with contact pins disposed in the socket body to thereby connect the socket body with the electrical component, and in particular, relates to an electrical component socket which is capable of urging the electrical component by a predetermined urging force even in the case of different thickness of the electrical component or different number of terminals thereof, and is applicable to a high functional device of larger heat dissipation amount.

BACKGROUND ART

In general, when a performance test is performed on an electrical component, such as an IC package or the like, there are used electrical component sockets each of which detachably retains the electrical component, to electrically connect it to an external measuring device. Among these electrical component sockets, the electrical component socket of so-called clamshell type includes: a socket body disposed with an accommodating portion which accommodates therein the electrical component; and a socket cover which is axially supported in rotatable at one side end portion of the socket body, and, in a closed state, presses to fix the electrical component accommodated in the accommodating portion. Furthermore, the electrical component socket to be applied to a high functional device of high power consumption includes a heat sink.

In the conventional electrical component socket of the type mentioned above, a pressure member for pressing the electrical component capable of moving up and down is disposed between the socket body and the socket cover, and a corrugated spring is made to intervene between an upper surface of the pressure member and a lower surface of the socket cover, so that the pressure member is pressed to the electrical component by an urging force of the corrugated spring. Furthermore, the heat sink capable of moving up and down is provided in the socket cover, so that the heat sink is urged downwards to be in contact with the electrical component, by a compression spring disposed on an upper surface of the socket cover.

Then, when the electrical component is retained by using such an electrical component socket, firstly, the socket cover is opened to thereby accommodate the electrical component in the accommodating portion of the socket body, and next, the socket cover is closed so that the electrical component is pressed to be fixed (refer to Patent literature 1).

CITATION LIST

Patent Literature

Patent Literature 1: Japanese Laid-open Patent Publication No. 2001-281295

SUMMARY

Technical Problem

However, in the above described conventional electrical component socket, a plurality of collar springs is disposed on the upper surface of the socket cover so as to pass through the heat sink, and helical compression springs are made to intervene between collars of the collar springs and the heat sink so that the heat sink is urged downwards. Therefore, a plurality of holes for the collar springs needs to be disposed on the heat sink, and accordingly, a heat dissipation area of the heat sink is decreased, resulting in a decrease of heat dissipation amount. Furthermore, since the heat sink is completely floated by the helical compression springs, all of counterforce from the electrical component needs to be received by the helical compression springs, and accordingly, spring forces of the helical compression springs need to be enhanced. Furthermore, the conventional electrical component socket is not provided with a device for adjusting an urging force for urging the electrical component by the socket cover, and therefore, it is not possible to urge plural types of electrical components of different thickness or different number of pins by appropriate urging forces according to the different thickness or the different number of pins. Still further, since a pressing device for pressing the electrical component and an urging device for urging the heat sink are separately provided, a mechanism of the electrical component socket is complicated, and accordingly, a number of parts is increased.

Therefore, in view of the above problems, the present invention has an object to provide an electrical component socket which is capable of urging the electrical component by a predetermined urging force even in the case of different thickness of the electrical component or different number of terminals thereof, and also, is applicable to a high functional device of larger heat dissipation amount.

Solution to Problem

In order to achieve the above object, in an electrical component socket according to the invention which includes a socket body having an accommodating portion for detachably accommodating therein an electrical component; plural contact pins disposed in the socket body, which is capable to be close to and apart from terminals of an electrical component; and a socket cover rotatably attached to the socket body, and when the socket cover is closed, press-retains an electrical component accommodated in the accommodating portion so that the terminals of an electrical component are in contact with the contact pins, the socket cover is movably disposed to be close to the socket body and apart from the socket body when the socket cover is closed, thereby enabling the electrical component which is accommodated to be press-retained in the accommodating portion, to be urged by a predetermined urging force according to a thickness of the electrical component or a number of terminals thereof.

According to the above-mentioned configuration, the electrical component accommodated to be press-retained in the accommodating portion is urged by the predetermined urging force according to the thickness of the electrical component and the number of terminals thereof, by the socket cover which is disposed movably to be close to the socket body and apart from the socket body when the socket cover is closed.

Furthermore, the socket body includes first shaft holes formed on a side of one side end portion thereof and the socket cover includes second shaft holes formed on a side of one end portion thereof, and the socket cover is rotatably attached to the socket body, by aligning a center axis of each of the second shaft holes with a center axis of each of the first shaft holes, to insert a shaft through the second shaft holes and the first shaft holes. A cross-sectional shape of each of the first shaft holes of the socket body is formed in a long hole shape which enables the shaft to be moved to be close to the socket body and apart from the socket body in the first shaft holes, and also, there is provided an urging device for urging the shaft to be close to the socket body when the socket cover is closed. As a result, in the state of including the socket body which includes the first shaft holes formed on the side of the one side end portion thereof, and the socket cover which is rotatably attached to the socket body, by aligning the center axis of each of the second shaft holes formed on the side of the one side end portion of the socket cover with the center axis of each of the first shaft holes of the socket body, to insert the shaft through the second shaft holes and the first shaft holes, the cross-sectional shape of each of the first shaft holes of the socket body is formed in the long hole shape, to enable the shaft to be moved, in the shaft holes of the socket body, to be close to the socket body and apart from the socket body, and furthermore, the shaft is urged to be close to the socket body by the urging device when the socket cover is closed.

Moreover, the urging device includes torsion springs axially supported by a fixed axis disposed on the one side end portion of the socket body, a fixed portion at a base end of each torsion spring is fixed to the socket body and a movable portion at a tip end thereof urges the socket cover to be close to the socket body. As a result, the movable portion at the tip end of each torsion spring urges the socket cover to be close to the socket body, by the urging device including the torsion springs axially supported by the fixed axis disposed on the one side end portion of the socket body, in which the fixed portion at the base end is fixed to the socket body.

Still further, an urging force adjusting device capable of adjusting the urging force by the urging device is additionally disposed to the socket body. As a result, the urging force by the urging device can be adjusted by the urging force adjusting device additionally disposed to the socket body.

Even still further, an urging adjusting device for pressing or press-releasing the fixed portion on the base end to displace the fixed portion in a direction of changing the urging force by the torsion springs, to thereby change an initial deflection amount of the torsion springs, is provided in the socket body. As a result, the fixed portion on the base end is pressed or press-released, to be displaced in the direction of changing the urging force by the torsion springs, by the urging force adjusting device provided in the socket body, to thereby change the initial deflection amount of the torsion springs.

Moreover, an open portion passing from a lower surface of the socket cover to an upper surface thereof is disposed and, into the open portion a heat sink is swingably mounted, to thereby press the electrical component accommodated in the accommodating portion by a lower surface of the heat sink. As a result, the electrical component accommodated in the accommodating portion is pressed by the lower surface of the heat sink which is swingably mounted into the open portion disposed to pass from the lower surface of the socket cover to the upper surface thereof.

Advantageous Effects of Invention

According to claim 1 of the invention, the electrical component accommodated in the accommodating portion to be press-retained can be urged by the predetermined urging force according to the thickness of the electrical component or the number of terminals thereof, by the socket cover which is disposed movably to be close to the socket body and apart from the socket body when the socket cover is closed. Consequently, even in the case of different thickness of the electrical component or different number of terminals thereof, the electrical component can be pressed to be fixed by the appropriate urging force while avoiding deficient pressing or excessive pressing, thereby achieving stable electrical connection.

Furthermore, according to claim 2 of the invention, in the state of including the socket body which includes the first shaft holes formed on the side of the one side end portion thereof, and the socket cover which is rotatably attached to the socket body, by aligning the center axis of each of the second shaft holes formed on the side of the one side end portion of the socket cover with the center axis of each of the first shaft holes of the socket body, to insert the shaft through the second shaft holes and the first shaft holes, the cross-sectional shape of each of the first shaft holes of the socket body is formed in the long hole shape, to enable the shaft to be moved, in the shaft holes of the socket body, to be close to the socket body and apart from the socket body, and furthermore, the shaft is urged to be close to the socket body by the urging device when the socket cover is closed. Consequently, the shaft is permitted to move in the shaft holes until the urging force by the urging device on the shaft to be close to the socket body is balanced with the counterforce from the electrical component to be spaced from the socket body. Thus, in the case in which the socket cover is closed so that the electrical component accommodated in the accommodating portion of the socket body is pressed to be fixed, the height of the accommodating portion, which is formed depending on a distance from an upper surface of the accommodating portion to a bottom surface of the socket cover, is set in advance to be equal to or lower than a lower limit value of a height dimension of the electrical component, so that even in the case in which the height dimension of the electrical component is a minimum value within tolerance, the electrical component can be pressed to be fixed by the appropriate urging force while avoiding deficient pressing. Furthermore, in the case in which the height dimension of the electrical component is larger than the minimum value within the tolerance, the electrical component can be pressed to be fixed by the appropriate urging force while avoiding excessive pressing, thereby achieving the stable electrical connection.

Furthermore, according to claim 3 of the invention, the movable portion at the tip end of each torsion spring can urge the socket cover to be close to the socket body, by the urging device including the torsion springs axially supported by the fixed axis disposed on the one side end portion of the socket body, in which the fixed portion at the base end thereof is fixed to the socket body. Consequently, the urging device can be formed in a simple structure. Moreover, the pressing of the electrical component by the socket cover is performed by retaining the other side end portion of the socket cover while urging the one side end portion thereof by the torsion springs. Therefore, by utilizing a lever principle with the other side end portion as a support, the electrical component can be pressed by a predetermined force even if an elastic force of the torsion springs is small.

Still further, according to claim 4 or claim 5 of the invention, the urging force by the urging device can be adjusted by the urging force adjusting device additionally disposed to the socket body. Consequently, plural types of electrical components of different thickness or different number of pins can be urged by the appropriate urging forces according to the different thickness thereof or the different number of pins thereof.

Even still further, according to claim 6 of the invention, the fixed portion on the base end can be pressed or press-released, to be displaced in the direction of changing the urging force by the torsion springs, by the urging force adjusting device provided in the socket body, to thereby change the initial deflection amount of the torsion springs. Consequently, it is possible to change freely a deflection amount of the fixed portion on the base end to thereby variably adjust the urging force of the torsion springs.

Moreover, according to claim 7 of the invention, the electrical component accommodated in the accommodating portion can be pressed by the lower surface of the heat sink which is swingably mounted into the open portion disposed to pass from the lower surface of the socket cover to the upper surface thereof. Consequently, even in the case in which the socket cover becomes oblique to the electrical component as a result that the one side end portion of the socket cover is vertically moved, the heat sink mounted on the socket cover is swung, so that the socket cover can always be held to be parallel with the electrical component and the electrical component can be evenly pressed over the whole thereof. Therefore, any urging device for the heat sink is not necessary to be disposed separately, and accordingly, the heat sink can be enlarged for that space, thereby improving the dissipation performance of the heat sink. Furthermore, the structure can be simplified and the number of parts can be decreased.

EXPLANATION OF REFERENCE SYMBOLS

1 . . . socket body, 2 . . . socket cover, 4 . . . accommodating portion, 7 . . . first shaft hole, 9 . . . second shaft hole, 10 . . . shaft, 16 . . . torsion spring (urging device), 17 . . . fixed portion, 18 . . . movable portion, 22 . . . urging force adjusting device, 25 . . . heat sink

DESCRIPTION OF EMBODIMENTS

Embodiments of the present invention will be described hereunder, based on the accompanying drawings.

Figure 1:
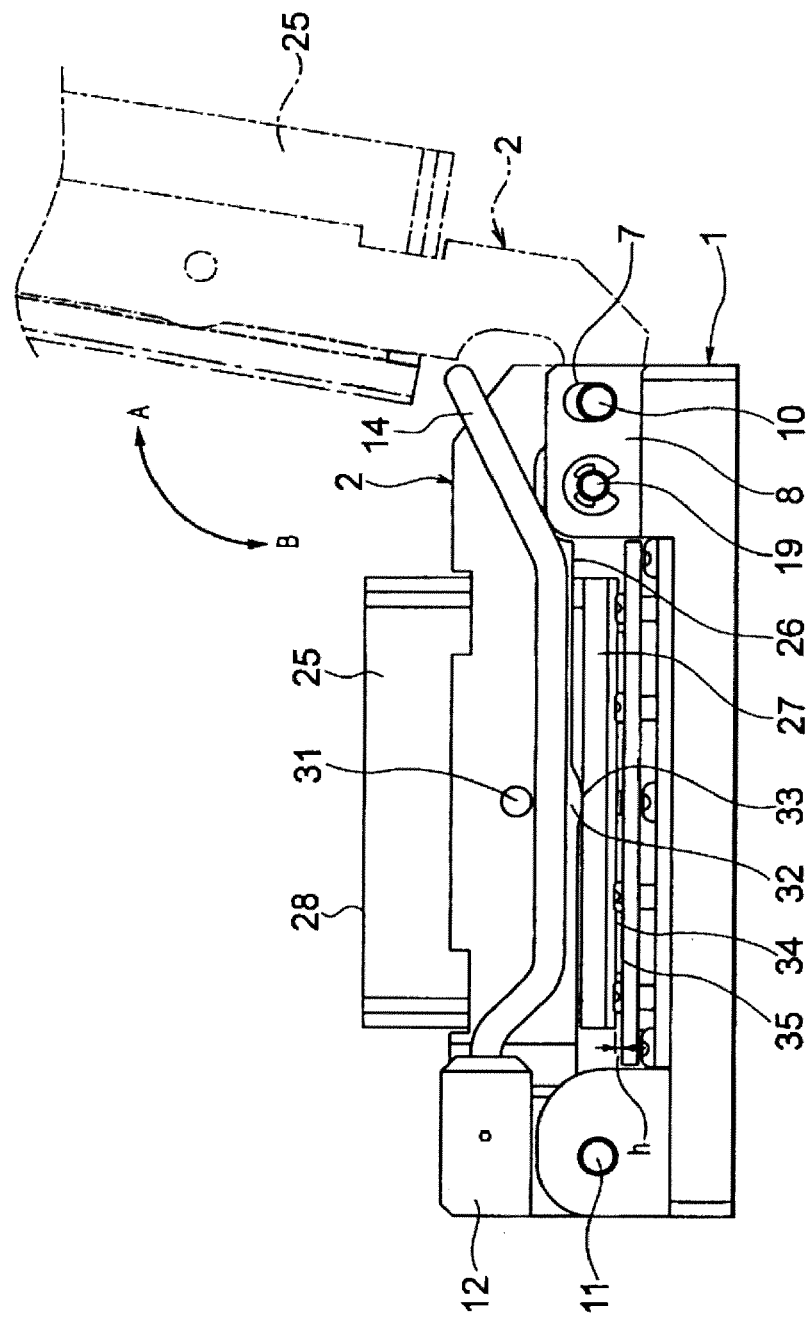
FIG. 1 is a front view illustrating an embodiment of an electrical component socket according to the present invention.

FIG. 1 is a view illustrating an embodiment of an electrical component socket according to the invention. This electrical component socket is, for example, a socket of clamshell type for closing a socket cover to a socket body to press-retain an electrical component accommodated in the socket body, and making terminals of the electric component to be in contact with contact pins disposed in the socket body to thereby connect the socket body with the electrical component, and includes a socket body 1 and a socket cover 2.

Figure 2:
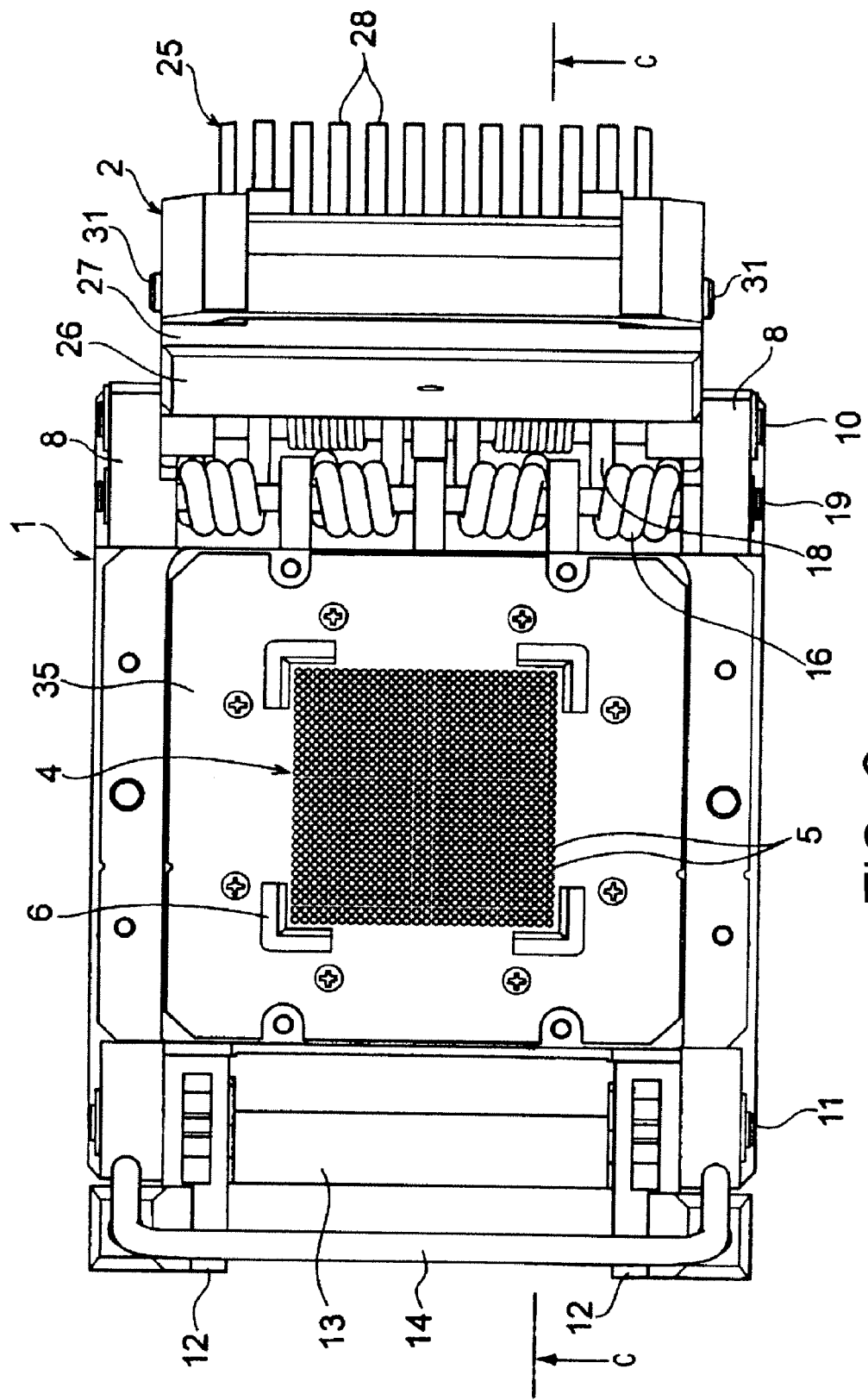
FIG. 2 is a plan view of the electrical component socket illustrated in FIG. 1, in which a socket cover, a latch member and a lever member are opened.

The socket body 1 serves as a base member of the electrical component socket, and is molded in a planar shape from a resin of high intensity and excellent heat resistance. As illustrated in FIG. 2, on an approximately center portion of the socket body 1, there is disposed an accommodating portion 4 for detachably accommodating an IC package (not shown in the figure) as the electrical component, and on an upper surface of the accommodating portion 4, a plurality of contact pins 5 is disposed in matrix to achieve electric connection with a plurality of terminals disposed on a lower surface of the IC package. Furthermore, on four corner portions of the accommodating portion 4, there are disposed approximately L-shaped guide portions 6, which serve as guides for when the IC package is accommodated in the accommodating portion 4, and also, control to positioning lateral surfaces of the IC package. Moreover, on a front portion and a rear portion of one side end portion (one side on the right side in FIG. 2) of the socket body 1, body side bearings 8, 8 are disposed, and on each body side bearing 8, a first shaft hole 7 is formed in parallel with the one side end portion of the socket body 1.

Furthermore, as illustrated in FIG. 1, to the one end side portion of the socket body 1, the socket cover 2 is rotatably attached in an arrow A or B direction. This socket cover 2 is for press-fixing the IC package accommodated in the accommodating portion 4 (refer to FIG. 2) in a state where the socket cover 2 is closed. On a front portion and a rear portion and also an intermediate portion of one side end portion of the socket cover 2 (one side on the right side in FIG. 4), cover side bearings 3 are disposed, and on each cover side bearing 3, a second shaft hole 9 is formed in parallel with the one side end portion of the socket cover 2. Then, as illustrated in FIG. 2, the cover side bearings 3 are fitted into the body side bearings 8, 8 of the socket body 1, and a center axis of each of the first shaft holes 7 of the body side bearings 8, 8 is aligned with a center axis of each of the second shaft holes 9 of the cover side bearings 3, to thereby insert a shaft 10 through the first shaft holes 7 and the second shaft holes 9, so that the socket cover 2 is attached to the socket body 1 so as to be rotatable via the shaft 10.

Figure 3:
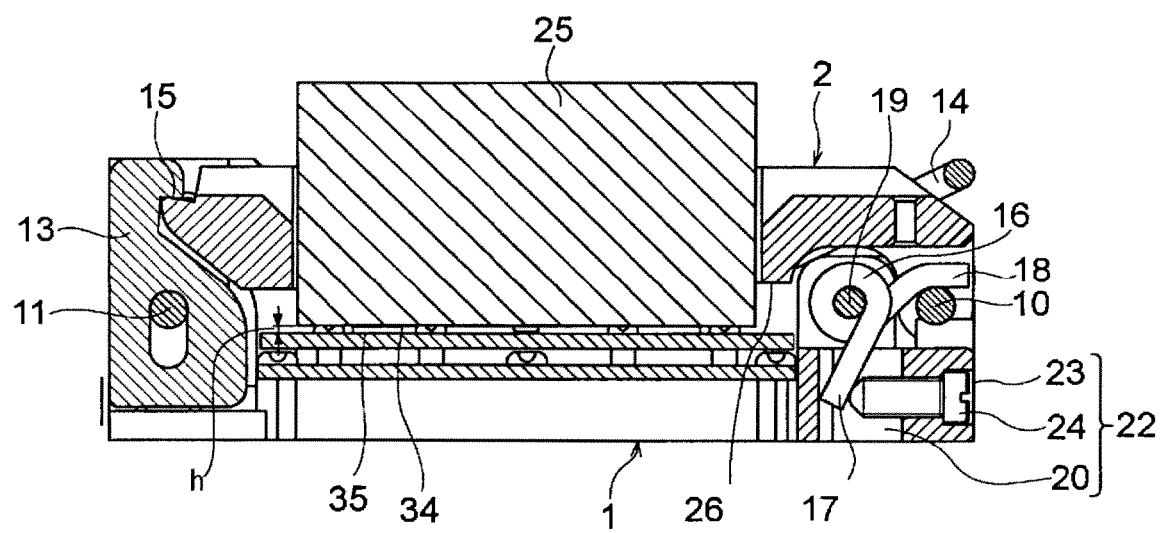
FIG. 3 is a cross-sectional view of FIG. 1 along C-C line in FIG. 2.

Furthermore, on the other side end portion (one side on the left side in FIG. 2) of the socket body 1, a latch shaft 11 is disposed in parallel with this side, and a latch member 13 and a lever member 14 are axially supported by the latch shaft 11. The latch member 13 is for holding the closed state of the socket cover 2, and is rotated around the latch shaft 11 to be opened or closed. As illustrated in FIG. 3, when the socket cover 1 is closed as illustrated in FIG. 1, the latch member 13 is engaged with a tip end portion 15 of the closed socket cover 2, to thereby hold the closed state of the socket cover 2.

Still further, as illustrated in FIG. 1, the lever member 14 is for further pressing downwards the socket cover 2 in the closed state, and is rotated around the latch shaft 11 to be opened or closed, and includes, on a base portion 12 thereof, a cam member (not shown in the figure) which is in sliding-contact with the latch member 13. Consequently, in the state where the socket cover 2 is closed, the lever member 14 is further closed, so that the latch member 13 is pressed downwards to be spaced from the socket body 1 by the cam portion, and thus, the socket cover 2 is further moved downwards from the closed state to thereby press the IC package to be fixed.

Here, in the present invention, the socket cover is disposed in movable to be close to the socket body and apart from the socket body, when the socket cover is closed, so that the electrical component which is accommodated in the accommodating portion 5 to be press-retained, can be urged by a predetermined urging force according to the thickness of the electrical component or the number of terminals thereof. To be specific, a cross-sectional shape of the first shaft hole 7 disposed in each of the body side bearing 8 of the socket body 1 is formed in a long hole shape so that the shaft 10 is movable to be close to the socket body 1 and apart from the socket body 1 in the first shaft hole 7. The first shaft hole 7 makes the shaft 10 to be movable upwards to be spaced from the socket body 1 in the first shaft hole 7 disposed in each of the body side bearing 8 of the socket body 1, and with this upward movement of the socket body 1, makes the socket cover 2 to be movable upwards.

Even still further, as illustrated in FIG. 2, on the one side end portion of the socket body 1, torsion springs 16 are provided. Each of the torsion springs 16 serves as an urging device for urging the socket cover 2 downwards via the shaft 10 when the socket cover 2 is closed, and is axially supported by a fixed shaft 19 provided in the body side bearings 8, 8, and further, as illustrated in FIG. 3, a fixed portion 17 on a base end of the torsion spring 16 is fixed to the socket body 1 and a movable portion 18 on a tip end thereof urges the shaft 10 downwards. Incidentally, in the present embodiment, as illustrated in FIG. 2, four torsion springs 16 are disposed to be axially supported by the fixed shaft 19 at equal spacing.

Moreover, as illustrated in FIG. 3, an urging force adjusting device 22 is disposed below the body side bearings 8, 8 of the socket body 1. This urging force adjusting device 22 is for adjusting a downward urging force which is fed to the shaft 10 by the torsion springs 16, and includes an adjusting hole 20, a threaded hole 23 and a screw 24 which are disposed in the socket body 1.

The adjusting hole 20 is disposed to pass through from a lower surface of the socket body 1 to an upper surface thereof, so as to be in alignment with a position of the fixed portion 17 of the torsion spring 16, and is formed in, for example, a cylinder shape or a rectangular shape, so that the fixed portion 17 can be elastically deformed around the fixed shaft 19. Furthermore, the threaded hole 23 is disposed to pass through from a side face of the one side end portion of the socket body 1 to the adjusting hole 20, and is disposed in plural numbers (four in this embodiment) so as to be in alignment of a position of the adjusting hole 20. Then, the screw 24 is threaded in the threaded hole 23 to be in contact with the fixed portion 17 of the torsion spring 16, and is moved forwards or backwards, so that the fixed portion 17 is pressed or press-released to be displaced, and an initial deflection amount of the torsion spring 16 is changed, so that the urging force to be fed to the shaft 10 by the movable portion 18 is adjusted.

Figure 4:
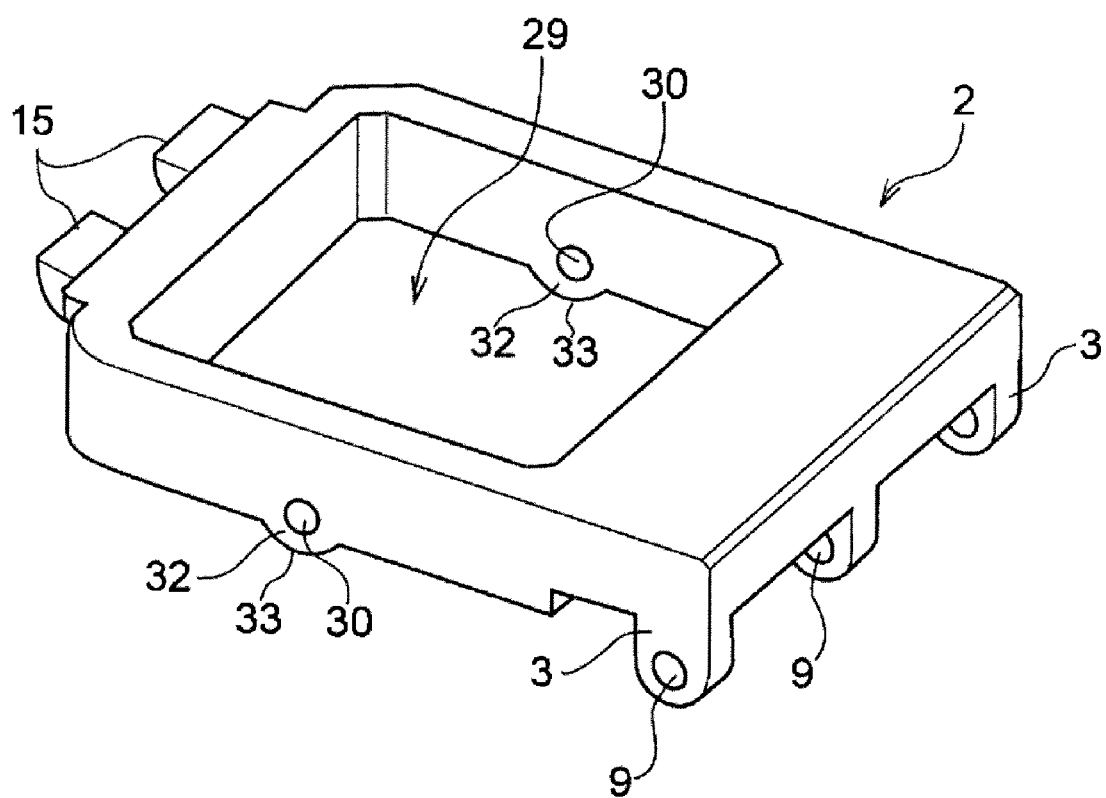
FIG. 4 is a perspective view illustrating the socket cover of the electrical component socket.

Moreover, as illustrated in FIG. 4, an open portion 29 passing from a lower surface of the socket cover 2 to an upper surface thereof is disposed, and as illustrated in FIG. 1, a heat sink 25 is swingably mounted into the open portion 29. The heat sink 25 is in contact, at a lower surface 34 thereof, with an upper surface of the IC package accommodated in the accommodating portion 4 in the state where the socket cover 2 is closed, to press downwards the IC package, and also, conducts to dissipate a heat generated in the IC package when the power is supplied at a performance test time. The heat sink 25 includes, on the lower surface thereof, a contact portion 27 formed in a planar shape to be in contact with the IC package, and a large number of dissipation fins 28 is provided on an upper portion thereof. Then, the heat sink 25 is axially supported by inserting a shaft 31 through shaft holes 30 disposed to the socket cover 2 (refer to FIG. 4), at approximately center portions of a front face of the heat sink 25 and a rear face thereof. Incidentally, a front side of the contact portion 27 and a rear side thereof are formed to be longer than the front and rear faces of the heat sink 25, so as to be in contact with semicircular portions 32 (to be described later) formed on the lower surface of the socket cover 2.

Furthermore, on the lower surface of the socket cover 2, as illustrated in FIG. 4, the semicircular portions 32, 32 each of which tip end protrudes downwards in a semicircular shape, are each formed on a position equivalent to a lower portion of the shaft 31. As illustrated in FIG. 1, the semicircular portion 32 is in contact with, at a tip end portion 33 thereof, an upper surface of the contact portion 27 of the heat sink 25, to serve as a center of rotation of the heat sink 25.

Next, there will be explained a usage state of the electrical component socket configured as described in the above. Firstly, in order to accommodate the IC package in the electrical component socket, as illustrated in FIG. 2, the lever member 14, the latch member 13 and the socket cover 2 are opened, to thereby accommodate the IC package in the accommodating portion 4 of the socket body 1. At this time, the IC package is controlled at the lateral surfaces thereof by the guide portions 6 disposed on the four corner portions of the accommodating portion 4, to be positioned, and then, is guided to a predetermined position to be reliably accommodated in the electrical component socket.

Next, the socket cover 2 is closed in the arrow B direction, and as illustrated in FIG. 3, the tip end portion 15 thereof is latched with the latch member 13, so that the socket cover 2 is brought into the closed state. Thereafter, when the lever member 14 is closed, as illustrated in FIG. 1, the latch member 13 is pressed downwards by the cam member (not shown in the figure) disposed on the base portion 12 of the lever member 14, to thereby further press the socket cover 2 downwards.

Here, in the case in which tolerance of height dimension of the IC package accommodated in the accommodating portion (refer to FIG. 2) is large and the upper surface of the IC package is higher than the accommodating portion height h formed depending on a distance of from an upper surface 35 of the accommodating portion 4 to the lower surface 34 of the heat sink 25, against the downward pressing force acted on the IC package by the socket cover 2, an upward counterforce is acted on the socket cover 2 from the IC package. Therefore, the shaft 10 moves upwards within the first shaft hole 7 until such a counterforce is balanced with the urging force by the torsion springs 16 which urge the socket cover 2 downwards, and thus, the socket cover 2 moves upwards. At this time, the socket cover 2 moves upwards only at a shaft 10 side thereof, and therefore, is in contact obliquely with the IC package to press the IC package only by the side of the other side end portion thereof. However, the heat sink 25 pressing the IC package is swung around the semicircular portions 32 of the socket cover 2 to be in contact with the upper surface of the IC package in parallel, so that the IC package can be pressed uniformly over the whole surface thereof. As a result, the IC package can be pressed to be fixed by the appropriate pressing force while avoiding excessive pressing.

Furthermore, in the case in which the tolerance of height dimension of the IC package accommodated in the accommodating portion 4 (refer to FIG. 2) is large and the upper surface of the IC package is lower than the accommodating portion height h, the socket cover 2 may not press the IC package. However, by setting in advance the accommodating portion height h to be equal to or lower than a lower limit value of the height dimension of the IC package, even in the case in which the height dimension of the IC package is a minimum value within the tolerance, the IC package can be pressed to be fixed by the appropriate pressing force while avoiding deficient pressing.

Next, when the IC package accommodated in the accommodating portion 4 (refer to FIG. 2) is removed, as illustrated in FIG. 2, after the lever member 14 is brought into an opened state, the closed state of the socket cover 2 by the latch member 13 is released, and further, the socket cover 2 is opened in the arrow A direction. Thus, the IC package can be removed from the accommodating portion 4. Incidentally, at this time, with the release of the downward pressing force fed to the IC package by the socket cover 2, the counterforce from the IC package is also released, so that the shaft 10 is pressed by the movable portion 18 (refer to FIG. 3) of each torsion spring 16 to move downwards to the lowest point of the first shaft hole 7, and with this downward movement of the shaft 10, the socket cover 2 also moves downwards.

Figure 5:
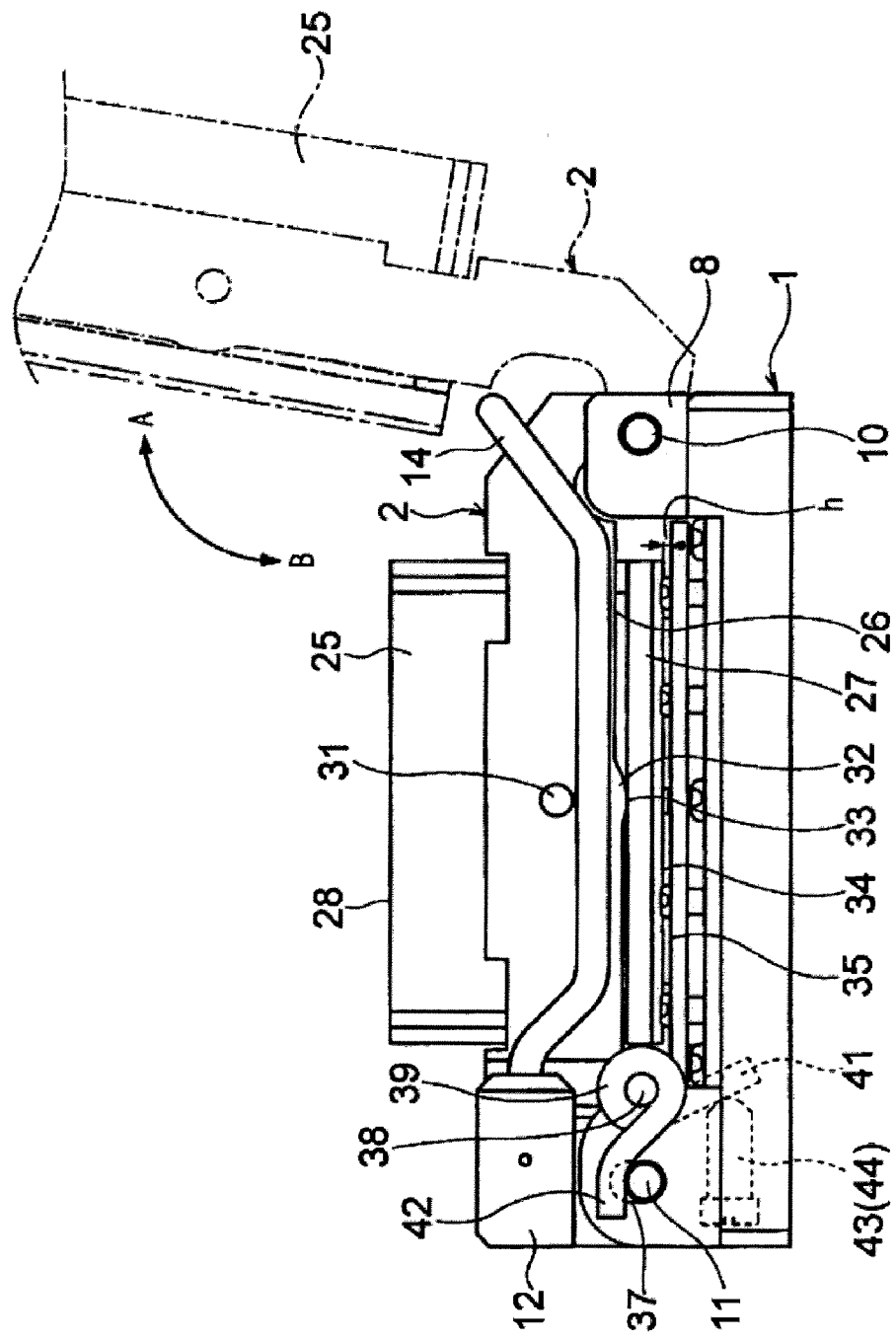
FIG. 5 is a front view illustrating another embodiment of the electrical component socket.

FIG. 5 is a front view illustrating another embodiment of the electrical component socket according to the invention. In this embodiment, on the one side end portion of the socket body 1, the shaft 10 is disposed in parallel with the side thereof, and the socket cover 2 is axially supported by the shaft 10 so as to be rotatable in the arrow A or B direction. Furthermore, on the other side end portion of the socket body 1, the latch shaft 11 is disposed in parallel with the side thereof, and the latch member 13 and the lever member 14 are axially supported by the latch shaft 11.

Here, the latch shaft 11 is inserted through a latch shaft hole 37 which is disposed to the socket body 1 and has a long cross-sectional shape in a height direction thereof, and is held to be movable in vertical. Furthermore, on the other side end portion of the socket body 1, a fixed shaft 38 is disposed in parallel with the latch shaft 38, and torsion springs 39 (each one on a front portion and a rear portion, in this embodiment) are axially supported by the fixed shaft 38. Then, a fixed portion 41 on a base end of each of the torsion springs 39 is fixed to the socket body 1, so that the latch shaft 11 is urged downwards by a movable portion 42 on a tip end of the torsion spring 39.

Moreover, an urging force adjusting device 44 including: an adjusting hole (not shown in the figure); a screw 43; and a threaded hole (not shown in the figure) which are formed similarly to those in the embodiment illustrated in FIG. 3, is disposed below the latch shaft 11 of the socket body 1, so that the urging force to be fed to the latch shaft 11 by the torsion spring 39 is adjustable. Furthermore, in the open portion 29 of the socket cover 2, the heat sink 25 is mounted to be swung, similarly to the embodiment illustrated in FIG. 1, so that the IC package accommodated in the accommodating portion 4 of the socket body 1 is pressed by the lower surface 34 of the heat sink 25.

Figure 6:
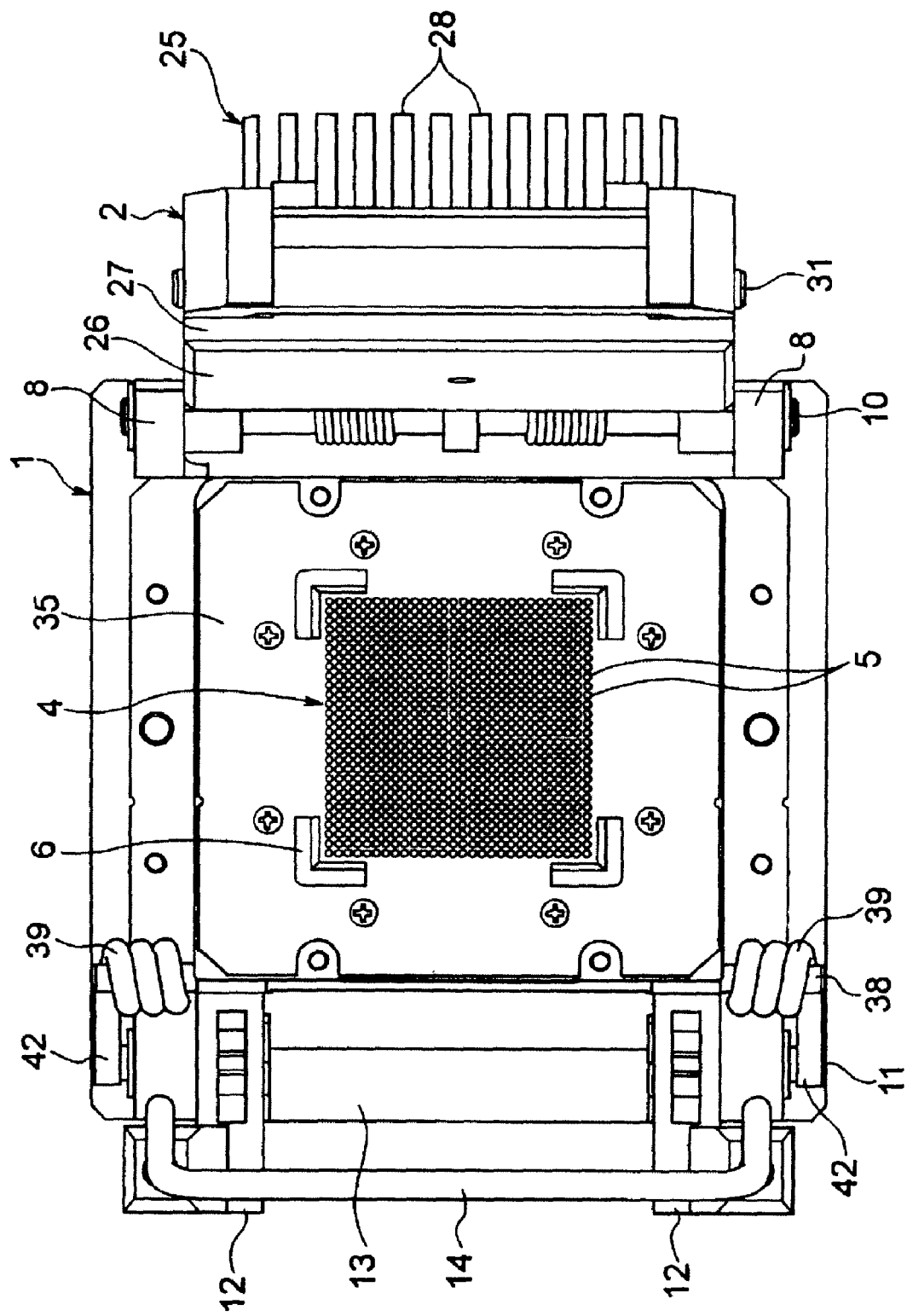
FIG. 6 is a plan view of the electrical component socket illustrated in FIG. 5, in which a socket cover, a latch member and a lever member are opened.

There will be described a usage state of this embodiment configured as in the above. Firstly, as illustrated in FIG. 6, the lever member 14, the latch member 13 and the socket cover 2 are opened, and the IC package is accommodated in the accommodating portion 4. Next, the socket cover 2 is closed in the arrow B direction, and the tip end portion 15 thereof is latched with the latch member 13, so that the socket cover 2 is brought into the closed state. Thereafter, when the lever member 14 is closed, as illustrated in FIG. 5, the latch member 13 is pressed downwards by the cam member (not shown in the figure) disposed on the base portion 12 of the lever member 14, to thereby further press the socket cover 2 downwards.

Here, in the case in which the upper surface of the IC package is higher than the accommodating portion height h, the latch shaft 11 moves upwards until a downward urging force of the torsion springs 39 is balanced with an upward counterforce from the IC package, and with this upward movement of the latch shaft 11, the latch member 13, the lever member 14 and the socket cover 2 move upwards. As a result, similarly to the embodiment illustrated in FIG. 1, by setting in advance the accommodating portion height h to be equal to or lower than the lower limit value, the IC package can be pressed to be fixed by the appropriate pressing force while avoiding the deficient or excessive pressing.

Next, when the IC package accommodated in the accommodating portion 4 (refer to FIG. 6) is removed, after the lever member 14 is brought into the opened state, the closed state of the socket cover 2 by the latch member 13 is released, and further, the socket cover 2 is opened in the arrow A direction. Thus, the IC package can be removed from the accommodating portion 4. Incidentally, at this time, with the release of the downward pressing force fed to the IC package by the socket cover 2, the counterforce from the IC package is also released, so that the latch shaft 11 is pressed by the movable portion 42 (refer to FIG. 5) of each of the torsion springs 39 to move downwards to the lowest point of the latch shaft hole 37, and with this downward movement of the latch shaft 11, the socket cover 2 also moves downwards.

Incidentally, in the above explanation, the downward urging of the socket cover 2 is performed by urging the shaft 10 or the latch shaft 11. However, the invention is not limited thereto, and the socket cover 2 may be directly urged. Furthermore, the torsion spring for urging the socket cover 2 downwards is used, but a compression spring, a blade spring, rubber or the like, for example, may be used. Moreover, not only an electrical component of which terminals thereof disposed on the lower surface are LGA formed in planar shapes but also an electrical component of which terminals are BGA formed in spherical shapes, may be applied as the electrical component to be detachably retained in the electrical component socket.

It should be appreciated that the entire contents of Japanese Patent Application No. 2007-270513, filed on Oct. 17, 2007, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

The invention claimed is:

1. An electrical component socket comprising:
    a socket body, the socket body having an accommodating portion for detachably accommodating therein an electrical component, and having plural contact pins contactable with terminals of the electrical component; and
    a socket cover rotatably attached to the socket body to be opened or closed,
    wherein, when the socket cover is closed, an electrical component accommodated in the accommodating portion is press-retained to contact the terminals of an electrical component with the contact pins,
    wherein a base end of the socket cover is rotatably attached to one end side portion of the socket body so that the socket cover is rotated around the one end side portion to be opened or closed, and a tip end portion of the closed socket cover is engaged with the other side end portion of the socket body to thereby hold the closed state of the socket cover, and the socket cover is movably disposed to be close to the socket body and apart from the socket body when the socket cover is closed,
    wherein on the one end side portion of the socket body, an urging device is disposed, the urging device urges the socket cover to be close to the socket body when the socket cover is closed,
    wherein on the other side end portion of the socket body, a lever member is disposed to be rotated around the other side end portion so that the socket cover is opened or closed, to make the socket cover in a closed state movable to be further close to the socket body, and
    wherein on the one side end portion of the socket body, an urging force adjusting device for adjusting an urging force of the urging device is disposed.

2. The electrical component socket according to claim 1, wherein the socket body comprises first shaft holes formed on a side of one side end portion thereof;

the socket cover comprises second shaft holes formed on a side of one end portion thereof, and the socket cover is rotatably attached to the socket body, by aligning a center axis of each of the second shaft holes with a center axis of each of the first shaft holes, to insert a shaft through the second shaft holes and the first shaft holes;

a cross-sectional shape of each of the first shaft holes of the socket body is formed in a long hole shape, to thereby make the shaft movable so that the socket cover is moved to be close to the socket body and apart from the socket body in the first shaft hole.

3. The electrical component socket according to claim 1, wherein the urging device comprises torsion springs axially supported by a fixed axis disposed on the one side end portion of the socket body, a fixed portion at a base end of each torsion spring is fixed to the socket body and a movable portion at a tip end thereof urges the socket cover to be close to the socket body.

4. The electrical component socket according to claim 3, wherein the urging force adjusting device presses or press-releases the fixed portion on the base end to displace the fixed portion in a direction of changing the urging force by the torsion springs and changes an initial deflection amount of the torsion springs.

5. The electrical component socket according to claim 1, wherein an open portion passing from a lower surface of the socket cover to an upper surface thereof is disposed, and a heat sink is swingably mounted in the open portion, to thereby press the electrical component accommodated in the accommodating portion by a lower surface of the heat sink.

6. The electrical component socket according to claim 1, further comprising a latch member disposed on the other side end portion of the socket body, for holding the closed state of the socket cover.

* * * * *